United States Patent [19]
Kofstad

[11] Patent Number: 5,833,337
[45] Date of Patent: Nov. 10, 1998

[54] SELF-RETAINING RACK SLIDE

[75] Inventor: Harvey R. Kofstad, Vernonia, Oreg.

[73] Assignee: Sequent Computer Systems, Inc., Beaverton, Oreg.

[21] Appl. No.: 855,734

[22] Filed: May 9, 1997

[51] Int. Cl.$^6$ .................................................. A47B 88/00
[52] U.S. Cl. .................. 312/334.5; 211/175; 248/298.1; 248/243; 312/334.8; 312/334.4
[58] Field of Search ............................ 312/334.5, 334.4, 312/334.7, 334.8, 350, 223.1, 265.1, 265.4, 319.1; 311/175, 103; 248/298.1, 243; 361/725, 727, 829, 825; 403/377; 384/22

[56] References Cited

U.S. PATENT DOCUMENTS

| | | | |
|---|---|---|---|
| 2,809,085 | 10/1957 | Fall | 312/334.8 X |
| 3,092,429 | 6/1963 | Barnes | 312/334.8 X |
| 3,133,768 | 5/1964 | Klakovich | 312/334.8 X |
| 3,851,578 | 12/1974 | Engebretsen | 312/334.4 X |
| 4,101,178 | 7/1978 | Adams et al. . | |
| 4,200,342 | 4/1980 | Fall . | |
| 4,728,162 | 3/1988 | Bruneau . | |
| 5,085,523 | 2/1992 | Hobbs . | |
| 5,229,919 | 7/1993 | Chen | 361/725 X |
| 5,300,973 | 4/1994 | Ternes et al. . | |
| 5,571,256 | 11/1996 | Good et al. . | |

FOREIGN PATENT DOCUMENTS 2064946  6/1981  United Kingdom ................ 248/298.1

*Primary Examiner*—Janet M. Wilkens
*Attorney, Agent, or Firm*—Klarquist Sparkman Campbell Leigh & Whinston

[57] ABSTRACT

A self-retaining rack slide for rack-mounted computer systems. The rack slide includes a slide and a rack mounting member which are fastened together while permitting relative longitudinal movement between the two parts. A biasing mechanism such as a spring is fastened to the mounting member and the slide to urge the two lengthwise apart to increase the length of the slide rack. A complementary slide fastened to a rack component slidingly engages the rack slide to permit the component to be slid into and out of the rack.

20 Claims, 4 Drawing Sheets

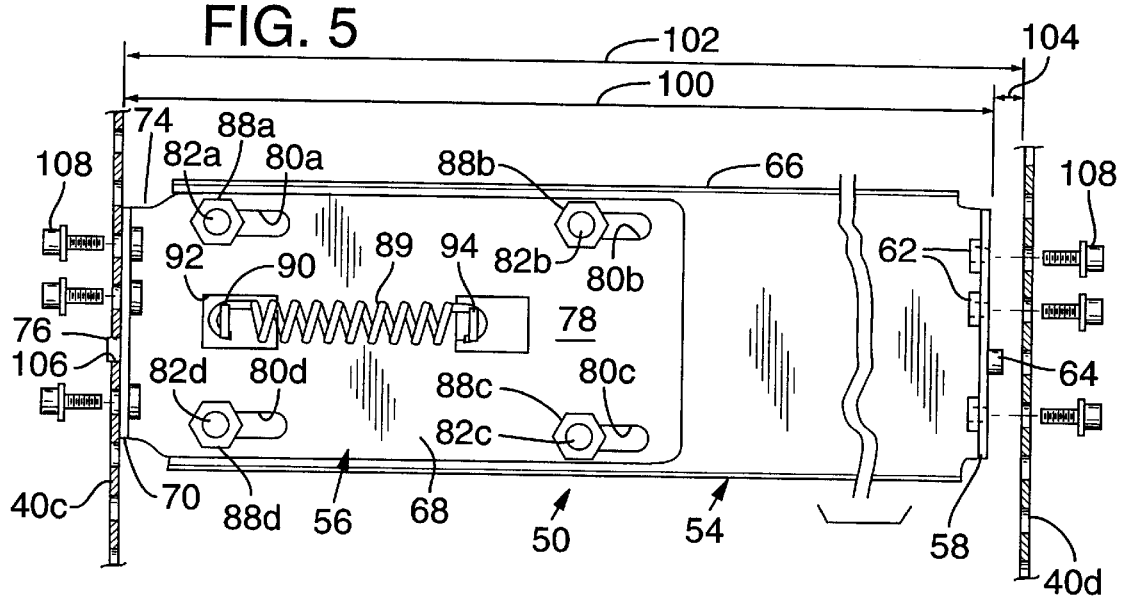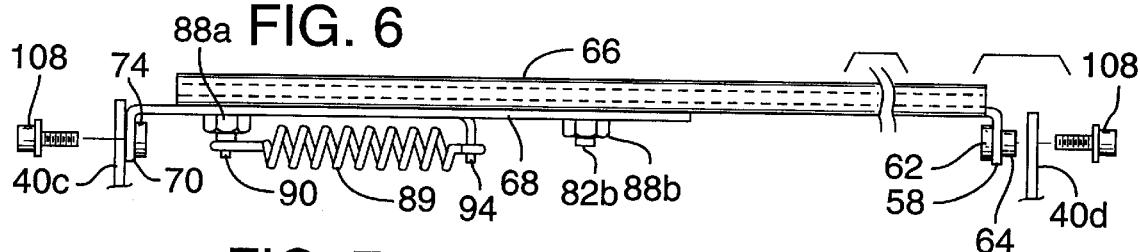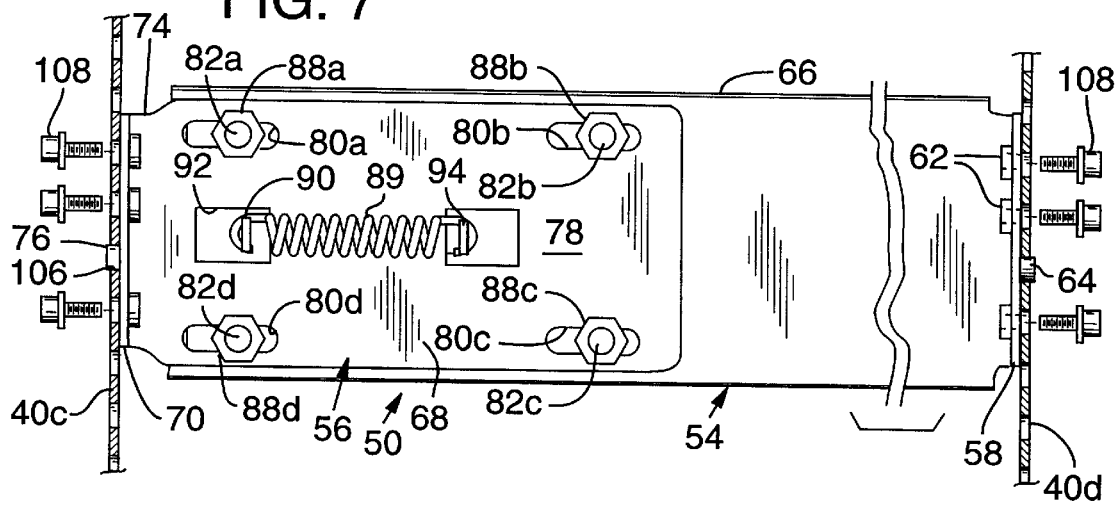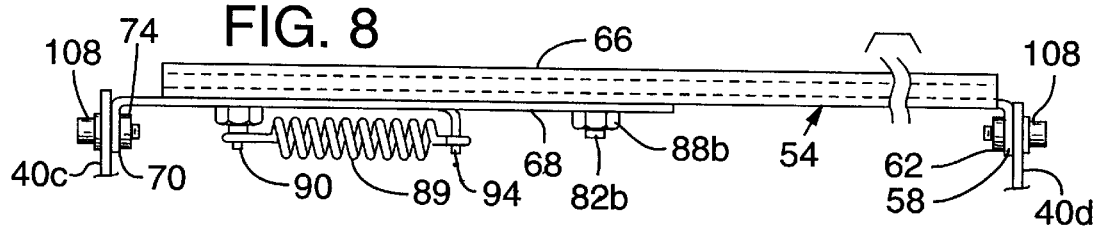

SELF-RETAINING RACK SLIDE

TECHNICAL FIELD

This invention relates generally to mechanisms for mounting drawers, components and the like to a frame such as a cabinet or rack. In particular, this invention relates to a rack slide that is self-retained in a component rack during the slide's installation, adjustment or removal.

BACKGROUND OF THE INVENTION

Sliding track devices have been used for years to permit drawers within a frame such as a cabinet to be easily opened or closed. Examples of these devices may be found in U.S. Pat. Nos. 4,101,178 and 4,200,342 and typically include a male slide and a complementary female slide that move relative to each other either by sliding or rolling. In use, one slide is secured to the cabinet and does not move. The other slide is secured to the drawer and telescopes into and out of the non-moving slide.

Sliding track devices are particularly useful for mounting computer or other electronic components to a component rack, such as shown in U.S. Pat. No. 5,571,256, so that the rack-mounted components can be slid out from the rack for easy access. In this application, two sliding track devices are used to support the component. One slide of each track device is attached to a side of the component. The other slide of each track device (referred hereafter to as a rack slide) is secured at the slide's ends to a pair of spaced-apart rack uprights, or channels, provided with mounting holes. The large number of mounting holes permit the positioning of rack slides to accommodate components of different size and number. Alternatively, the rack slide can be mounted to a slide support bracket that in turn is secured to the uprights as shown in the '256 patent.

A drawback of prior rack slides is the difficulty in mounting them to a rack because the distance between the front and rear uprights is not standard but varies with the depth of the components to be mounted. FIG. 2 shows a design for a prior adjustable rack slide to accommodate racks of different depth. The rack slide includes a slide 20 to one end of which a flange 22 is releasably fastened by a pair of bolts 24 and a nut plate 26 (the other end of the slide has a permanently mounted flange). These fasteners extend through holes in flange 22 and slots in the slide to allow the flange to be moved toward or away from the slide for shortening or lengthening the rack slide. The rack slide can be fixed at a desired length by tightening the fasteners at a point along the slots. The rack slide can then be mounted to a rack upright 28 with other fasteners 30 that extend through rack mounting holes and aligned flange holes. Although the length of the slide can be adjusted, sizing the rack slide correctly is tedious and time consuming. First, the distance between the rack uprights must be measured. Then the length of the rack slide must be manually adjusted to match the measured distance. Supporting a rack slide in the process of securing it to the uprights is also a problem. The rack slide must be aligned properly with the rack mounting holes before it can be fastened. While holding the rack slide in alignment, it must then be fastened on both ends to the rack uprights. Often, because of limited access around the rack, it is quite difficult to perform this maneuver without dropping nuts and bolts into the rack and its previously mounted components. Not only is it difficult to fasten rack slides in this manner, but any objects dropped in the process may cause damage to the computer system.

Accordingly, an objective of the invention is to provide a rack slide that automatically adjusts its length to fit between the uprights of a rack and is initially retained therein without the need for fasteners. The slide, while so retained, can then be easily fastened to the rack without the burden of aligning and supporting it in the process.

SUMMARY OF THE INVENTION

A rack slide according to the invention for a rack of the type having a pair of spaced-apart uprights includes a slide having a first end and a second end. A rack mounting member associated with the slide has a first end for mounting the member to a rack upright and a second end for aligning the member lengthwise with the slide second end. In a preferred embodiment, a fastener attached to one of the slide second end or member second end fastens the mounting member and the slide together while permitting lengthwise relative movement between the member and the slide. A biasing mechanism such as a spring then urges the mounting member and the slide lengthwise apart.

In one aspect of the invention, the rack slide includes a locating nib protruding from the first end of the mounting member for inserting into mounting holes of the rack upright. In another aspect of the invention, one of the slide second end or member second end includes a plurality of fasteners and the other of the slide second end or member second end includes a plurality of slots through which the fasteners extend for permitting relative movement along the length of the slots. In yet another aspect of the invention, the biasing mechanism includes a first arm extending from the second end of the slide, a second arm extending from the second end of the mounting member, and a spring mounted between the arms for urging the mounting member and the slide lengthwise apart.

The rack slide may also include a support bracket for supporting a slide such as used in a three-part slide tracking device.

A rack is a type of frame, and the invention may be embodied in compressible frame slides for use in frames other than racks such as for use in cabinets.

BRIEF DESCRIPTION OF THE DRAWINGS

FIG. 5 is a side view of the rack slide of FIG. 3 showing the slide compressed for inserting between the uprights of a rack.

FIG. 6 is a top view of the rack slide of FIG. 5.

FIG. 7 is side view of the rack slide of FIG. 3 showing the slide extended to engage the uprights of the rack.

FIG. 8 is a top view of the rack slide of FIG. 7.

DETAILED DESCRIPTION OF PREFERRED EMBODIMENTS

This specification incorporates by reference U.S. Pat. No. 5,571,256, which provides background information on rack-mounted computer systems.

Figure 1:
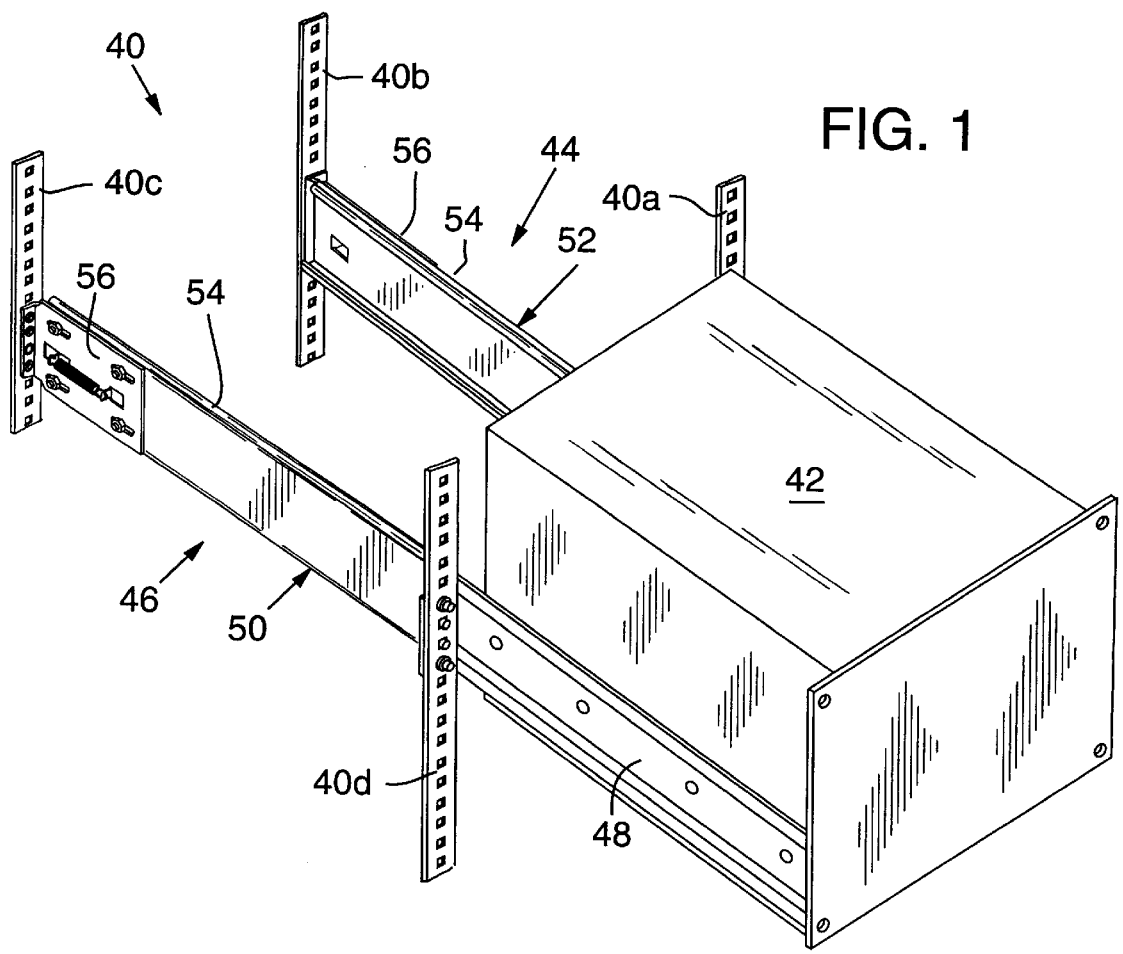
FIG. 1 is a perspective view of a portion of a rack-mounted computer system showing the four uprights of the rack, a computer component, and a pair of sliding track devices mounting the component to the rack.
Figure 2:
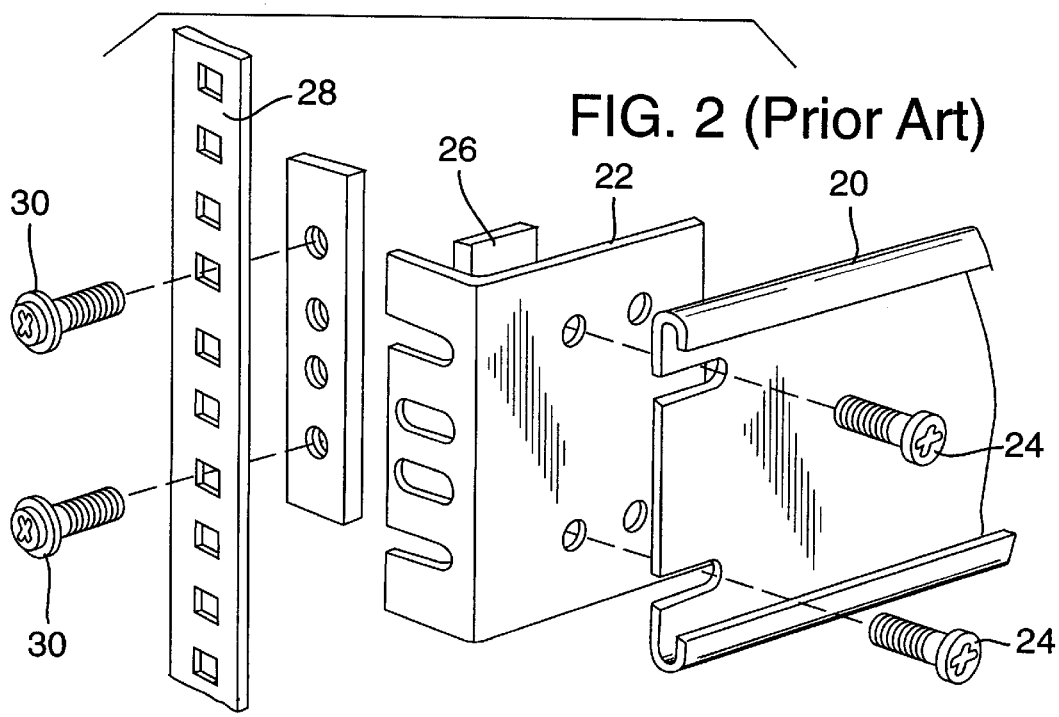
FIG. 2 is a fragmentary view of a prior adjustable rack slide.

FIG. 1 is a perspective view of a portion of a rack-mounted computer system showing the four uprights 40*a–d* of a rack 40, a computer component 42, and a pair of sliding track devices 44, 46 mounting the component to the rack. The sliding track devices permit the component to be moved in and out of the rack with relative ease. Sliding track device 46 includes a male component slide 48 attached to component 42 and a female rack slide 50 fastened between the pair of spaced-apart rack uprights 40*d* and 40*c*. Similarly, sliding track device 44 includes a male component slide (not visible) attached to component 42 and a female rack slide 52 fastened between the pair of spaced-apart rack uprights 40*a* and 40*b*. Rack slides 50 and 52, made in accordance with the invention, each include a female slide 54 and a mounting assembly 56. The mounting assembly, whose structure and operation will be described, automatically adjusts the length of the rack slide to fit snugly between the uprights and self retains the rack slide while it is fastened securely into place.

Figure 3:
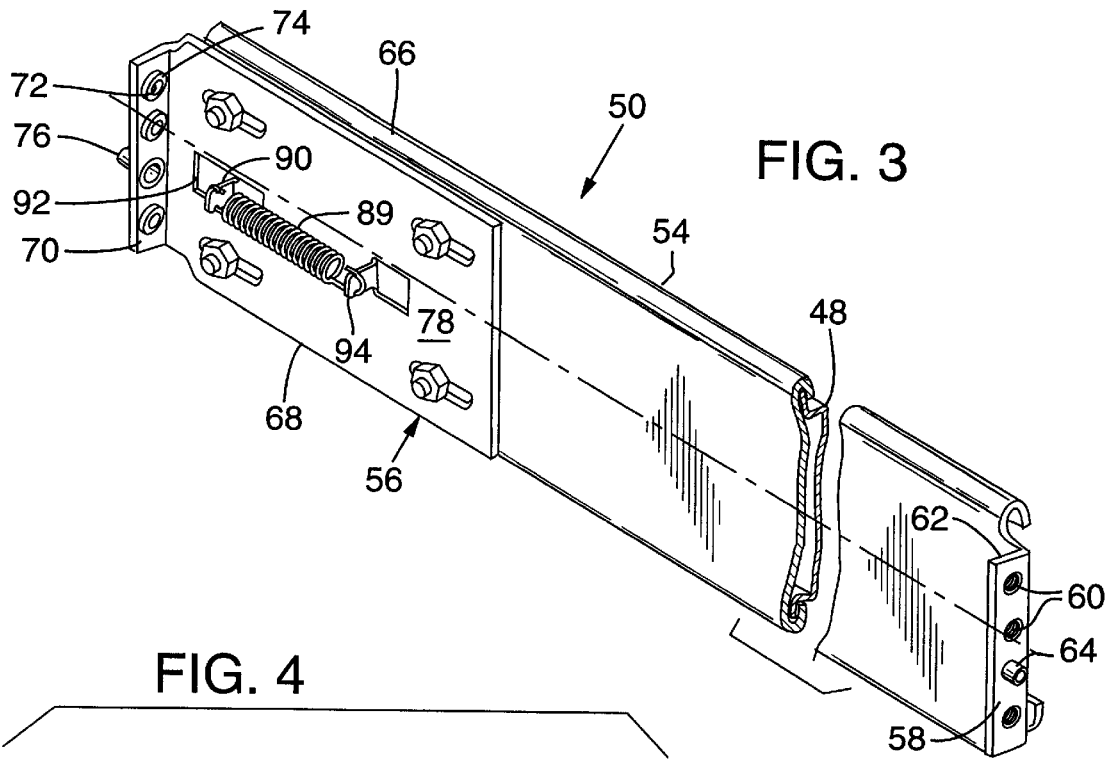
FIG. 3 is a perspective view of a first embodiment of a self-retaining rack slide according to the invention.

FIG. 3 is a perspective view of a first embodiment of a self-retaining rack slide 50 according to the invention. Rack slide 50 includes female slide 54 on one end of which is connected or fastened a connector such as a flange 58. Defined within the flange is a series of aligned mounting holes 60 for mounting the rack slide to a rack upright. Attached to one or more of mounting holes 60 are nuts 62 for threadedly engaging a bolt or other fastener first inserted through a mounting hole in the rack upright and a corresponding hole 60. Flange 58 also includes at least one protruding, cylindrically shaped locating nib 64 for engaging a mounting hole within the rack upright. As will be described, locating nibs on both ends of rack slide 50 help to align and support the rack slide within rack 40 while the slide is being fastened securely to the rack.

Figure 4:
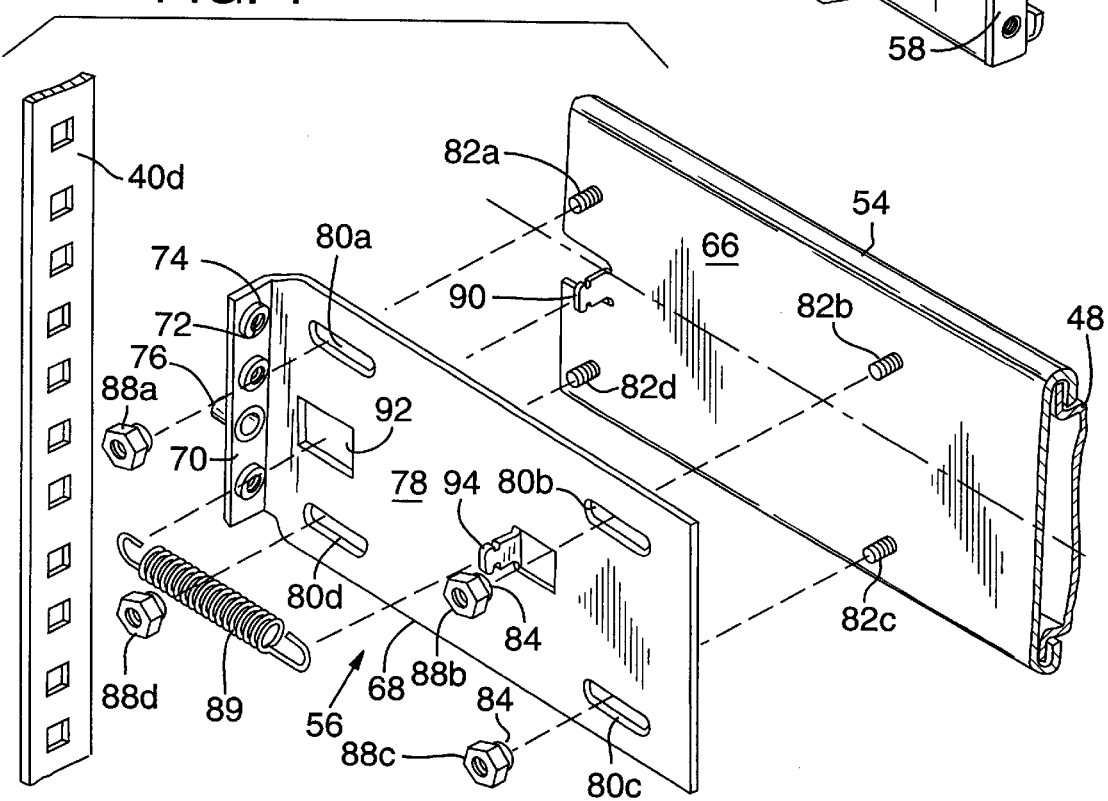
FIG. 4 is a fragmentary view of the rack slide of FIG. 3 showing a mounting assembly therein.

Fastened to a second end 66 of slide 54 is mounting assembly 56 that is shown in more detail in fragmentary view in FIG. 4. The mounting assembly includes a rack mounting member 68 having connected at a first end a flange 70 in which a series of mounting holes 72 is defined for mounting the member to another rack upright. Attached to one or more of mounting holes 72 are nuts 74 for threadedly engaging a bolt or other fastener first inserted through a mounting hole in the rack upright and a corresponding hole 72. Flange 70 also includes at least one protruding, cylindrically shaped locating nib 76 for engaging a mounting hole within the rack upright. Rack mounting member 68 also includes a flat second end 78 for aligning the member lengthwise with slide second end 66. Four parallel slots 80*a–d* are defined within end 78 through which fasteners 82*a–d* extend from slide end 66 for fastening the member to slide 54 while permitting relative movement along the length of the slots. As seen in FIG. 4, nuts 88*a–d* have a smooth shank portion 84 that slidingly engages the slots when the nut is tightened. The shank portion also spaces the nut head apart from member 68 to permit the desired relative movement along the length of the slots.

Mounting assembly 56 includes (in addition to member 68, fasteners 82*a–d* and nuts 88*a–d*) a biasing mechanism such as a spring 89 that lengthens the rack slide by urging mounting member 68 and slide 54 lengthwise apart. Spring 89 is fastened at one end to a first arm 90 that is attached to slide end 66 and extends perpendicularly therefrom through a slot 92 in member 68. The spring is fastened at its second end to a second arm 94 that is attached to member end 78 and extends perpendicularly therefrom. The tension of spring 89 pulls the two arms toward each other, thereby urging member 68 and slide 54 lengthwise apart. Alternatively, the slots could be defined in slide end 66 and the fasteners attached to member end 78. Spring 89 as shown is an extension spring. Alternatively compression, torsion and other types of springs can be used. In the case of a compression spring, arm 90 is attached to member end 78 and arm 94 is attached to slide end 66 so that the spring pushes the two arms apart to lengthen the rack slide. It should be understood, then, that many biasing mechanisms such as flexible material, etc., equivalent to the spring and arms can be used for biasing the member and slide.

The process for installing rack slide 50 between a pair of rack uprights is illustrated in FIGS. 5–8. On the left side of the figures is a rack upright such as upright 40*c* and on the right side is rack upright such as upright 40*d*. To install rack slide 50 in rack 40, an installer inserts locating nib 76 on flange 70 into a mounting hole 106 on rack upright 40*c* at a desired rack height. The installer then presses slide 54 and member 68 toward each other to compress the rack slide to a length 100 which is less than the distance 102 between the rack uprights, as shown in FIGS. 5 and 6. This compression moves arms 90 and 94 apart, extending spring 89. Member 68 and slide 54 move lengthwise toward each other until, if the rack slide is fully compressed, fasteners 82*a–d* reach the ends of slots 80*a–d* as shown. While so compressed, slide 54 is easily aligned with the mounting holes of rack upright 40*d* because there now exists a gap 104 between the compressed length 100 and distance 102.

After compressing the partially inserted rack slide 50, the slide is secured to the rack in several simple steps. First, the rack slide is aligned by an installer with upright 40*d*. Then the compressive pressure on the rack slide is slowly reduced, permitting spring 89 to lengthen the rack slide until locating nib 64 is inserted through the appropriate mounting holes 64 in upright 40*d*. Rack slide 50 is now self retained in rack 40 by nibs 64 and 76 and the bias of spring 89. To securely fasten the rack slide to the rack, fasteners 108 are inserted through the upright mounting holes and threaded into retained nuts 62 and 74 as shown in FIGS. 7 and 8. Note in these figures that fasteners 82*a–d* are now positioned in the middle of slots 80*a–d*.

Removing slide rack 50 from rack 40 is as simple as installing it. Fasteners 108 are unthreaded and removed, the rack slide is compressed until nib 64 is clear of the upright mounting holes of rack upright 40*d*, and the rack slide is moved away.

Figure 9:
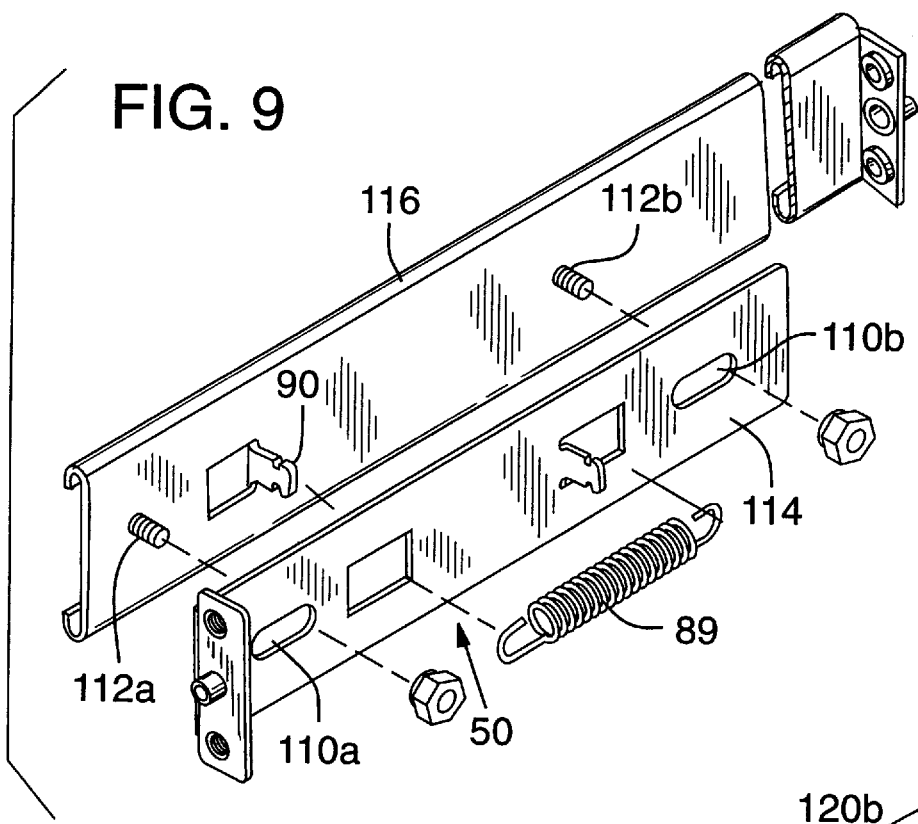
FIG. 9 is a fragmentary view of a second embodiment of a rack slide according to the invention.

FIG. 9 is a fragmentary view of a second embodiment of a rack slide according to the invention. In this embodiment, the size and number of various components of the rack slide have been changed to suit a particular application. For example, the mounting assembly includes a different arrangement of slots 110*a–b* and fasteners 112*a–b* to provide the desired relative movement between a rack mounting member 114 and slide end 116. This embodiment, however, employs the same principles of the invention as the first embodiment.

Figure 10:
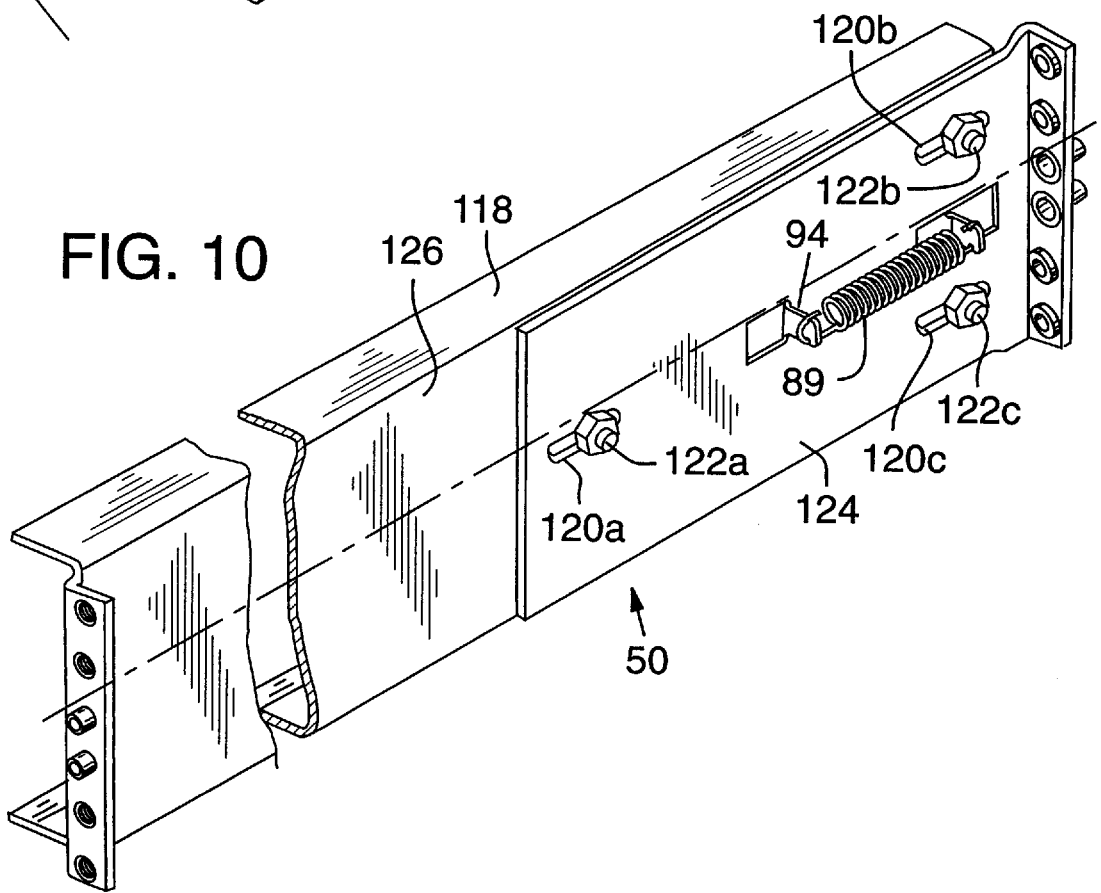
FIG. 10 is a fragmentary view of a third embodiment of a rack slide according to the invention.

Similarly, FIG. 10 is a fragmentary view of a third embodiment of a rack slide according to the invention. In this embodiment, as in that of FIG. 9, various components of the rack slide have been changed to suit a particular application. For example, slide 54 includes a shelf 118. The mounting assembly includes yet another arrangement of slots 120*a–c* and fasteners 122*a–c* to provide the desired relative movement between a rack mounting member 124 and slide end 126. This embodiment also employs the same principles of the invention.

It should be understood from the above description that various changes and modifications to the preferred embodiments may be made by those skilled in the art without departing from the principles of the invention. For example, the invention may be used to install male or female rack slides of a wide variety of shapes on a rack. The mounting assembly can be installed on both ends of the slide if desired. The rack slide may also take the form of a slide support bracket such as disclosed in U.S. Pat. No. 5,571,256 to which a separate slide is secured. The term "rack slide" therefore should be understood to include a slide support bracket built in accordance with the invention. Or the sliding track device of which the rack slide is a part may include ball-bearing assemblies between the rack slide and component slide, such as described in U.S. Pat. Nos. 4,200,342.

In view of these and the many other possible embodiments to which the principles of the invention can be applied, it should be understood that the following claims and not the preferred embodiments define the full scope of the invention. I therefore claim as my invention all that comes within the spirit and scope of these claims.

I claim:

1. A compressible rack slide for a rack of the type having a pair of spaced-apart first and second uprights, comprising:
   a slide having a first end and a second end;
   a rack mounting member having a first end for mounting the member to the first rack upright and having a second end for aligning the member lengthwise with the slide second end;
   a fastener attached to one of the slide second end or member second end, the fastener fastening the mounting member and the slide together while permitting lengthwise relative movement between the member and the slide; and
   a biasing mechanism lengthening the rack slide by urging the mounting member and the slide lengthwise apart.

2. The rack slide of claim 1 including a connector connected to the first end of the slide for mounting the rack slide to the second rack upright.

3. The rack slide of claim 1 including a locating nib protruding from the first end of the mounting member for inserting into mounting holes of the first rack upright.

4. The rack slide of claim 1 wherein one of the slide second end or member second end includes a plurality of the fasteners and the other of the slide second end or member second end includes a plurality of slots through which the fasteners extend for permitting relative movement along the length of the slots.

5. The rack slide of claim 1 wherein the biasing mechanism includes:
   a first arm extending from the second end of the slide;
   a second arm extending from the second end of the mounting member; and
   a spring mounted between the arms for urging the mounting member and the slide lengthwise apart.

6. The rack slide of claim 1 including a nut attached to each of the first ends of the mounting member and the slide, each nut attached around a mounting hole for securing threaded fasteners to the mounting member and the slide.

7. The rack slide of claim 1 wherein the slide is a support bracket for supporting a slide.

8. The rack slide of claim 1 wherein the rack slide is a first slide of a slide tracking device, the slide tracking device including a complementary second slide for attachment to a rack component.

9. The rack slide of claim 1 wherein the fastener includes a nut having a smooth shank portion.

10. A compressible rack slide for a rack of the type having a pair of first and second spaced-apart uprights provided with mounting holes comprising:
    a slide having connected at a first end a flange with mounting holes for mounting the slide to the first rack upright and a locating nib protruding from the flange for inserting into one of the mounting holes of the first rack upright, the slide having a second end;
    a rack mounting member having connected at a first end a flange with mounting holes for mounting the member to the second rack upright and a locating nib protruding from the flange for inserting into one of the mounting holes of the second rack upright, the member having a second end for aligning the member lengthwise with the slide second end, the member second end including a plurality of slots;
    a plurality of fasteners attached to the slide second end and extending through the slots in the member second end for fastening the mounting member and the slide together while permitting lengthwise relative movement between the member and the slide along the length of the slots; and
    a biasing mechanism urging the mounting member and the slide lengthwise apart, the biasing mechanism including a first arm extending from the second end of the slide, a second arm extending from the mounting member second end, and a spring mounted between the arms.

11. The rack slide of claim 10 wherein the rack slide is a first slide of a slide tracking device, the slide tracking device including a complementary second slide for attachment to a rack component.

12. The rack slide of claim 10 wherein the slide is a support bracket for supporting a slide.

13. A rack slide for a rack of the type having a pair of first and second spaced-apart uprights, comprising:
    a slide having connected at a first end a flange for mounting the slide to the first rack upright, the slide having a second end;
    a rack mounting member having connected at a first end a flange for mounting the member to the second rack upright, the member having a second end for aligning the member lengthwise with the slide second end;
    means for fastening the mounting member and the slide together while permitting lengthwise relative movement between the member and the slide; and
    means for urging the mounting member and the slide lengthwise apart.

14. The rack slide of claim 13 wherein each of the flanges has mounting holes.

15. A compressible frame slide for a frame, the frame slide comprising:
    a slide;
    a frame mounting member engaged to the slide to permit lengthwise relative movement between the member and the slide; and
    a biasing mechanism lengthening the frame slide by urging the mounting member and the slide lengthwise apart.

16. The frame slide of claim 15 wherein the frame mounting member is engaged to the slide by a fastener.

17. The frame slide of claim 15 wherein the frame slide is a rack slide.

18. A compressible frame slide for a frame, the frame slide comprising:

a slide;

a frame mounting member engaged to the slide to permit lengthwise relative movement between the member and the slide; and means for lengthening the frame slide by urging the mounting member and the slide lengthwise apart.

19. The frame slide of claim 18 wherein the frame mounting member is engaged to the slide by a means for fastening the mounting member and the slide together.

20. The frame slide of claim 18 wherein the frame slide is a rack slide.

* * * * *